(12) United States Patent
Song et al.

(10) Patent No.: US 11,737,305 B2
(45) Date of Patent: Aug. 22, 2023

(54) LIGHT-EMITTING DEVICE AND METHOD FOR MANUFACTURING THE SAME, AND DISPLAY PANEL

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Wei Song, Beijing (CN); Ce Zhao, Beijing (CN); Yuankui Ding, Beijing (CN); Ming Wang, Beijing (CN); Ning Liu, Beijing (CN); Leilei Cheng, Beijing (CN); Junlin Peng, Beijing (CN); Yingbin Hu, Beijing (CN); Liusong Ni, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 445 days.

(21) Appl. No.: 17/260,018

(22) PCT Filed: May 27, 2020

(86) PCT No.: PCT/CN2020/092580
§ 371 (c)(1),
(2) Date: Jan. 13, 2021

(87) PCT Pub. No.: WO2020/238952
PCT Pub. Date: Dec. 3, 2020

(65) Prior Publication Data
US 2021/0288283 A1    Sep. 16, 2021

(30) Foreign Application Priority Data
May 30, 2019 (CN) .......................... 201910464912.7

(51) Int. Cl.
*H10K 50/818*    (2023.01)
*H10K 71/00*    (2023.01)
(Continued)

(52) U.S. Cl.
CPC .......... *H10K 50/818* (2023.02); *H10K 71/00* (2023.02); *H10K 50/813* (2023.02); *H10K 59/12* (2023.02);
(Continued)

(58) Field of Classification Search
None
See application file for complete search history.

(56) References Cited

U.S. PATENT DOCUMENTS

2004/0245923 A1    12/2004  Park et al.
2009/0066237 A1    3/2009   Kambe et al.
(Continued)

FOREIGN PATENT DOCUMENTS

| CN | 110165080 | 8/2019 | |
| WO | WO-2011067895 A1 * | 6/2011 | ......... H01L 51/5088 |
| WO | WO-2021260487 A1 * | 12/2021 | |

OTHER PUBLICATIONS

PCT International Search Report (w/ English tranlation for corresponding PCT Application No. PCT/CN2020/092580, dated Aug. 26, 2020, 5 pages.
First Chinese Office Action (w/ English Translation) for corresponding Chinese Application No. 201910464912.7, dated Jan. 18, 2021, 20 pages.
(Continued)

*Primary Examiner* — Michael Lebentritt
(74) *Attorney, Agent, or Firm* — Dority & Manning, P.A.

(57) ABSTRACT

A light-emitting device includes: an anode disposed on a base, and a cathode disposed on a side of the anode facing away from the base. The anode includes a light-reflecting
(Continued)

sub-electrode and a light-transmitting sub-electrode located on a surface of the light-reflecting sub-electrode facing away from the base, and an orthographic projection of the light-transmitting sub-electrode on the base is located within a range of an orthographic projection of the light-reflecting sub-electrode on the base. The light-reflecting sub-electrode includes a metal pattern and a metal oxide pattern, and the metal oxide pattern is located in at least part of a region around the metal pattern.

17 Claims, 7 Drawing Sheets

(51) Int. Cl.
*H10K 50/813* (2023.01)
*H10K 59/12* (2023.01)
*H10K 101/30* (2023.01)
*H10K 102/10* (2023.01)
*H10K 102/00* (2023.01)

(52) U.S. Cl.
CPC ............... *H10K 2101/30* (2023.02); *H10K 2102/103* (2023.02); *H10K 2102/3026* (2023.02)

(56) References Cited

U.S. PATENT DOCUMENTS

| | | |
|---|---|---|
| 2012/0025224 A1 | 2/2012 | Yuasa |
| 2015/0206928 A1 | 7/2015 | Kimura et al. |
| 2017/0077437 A1 | 3/2017 | Kaida et al. |
| 2020/0176772 A1* | 6/2020 | Yamamoto ............ H01M 4/525 |

OTHER PUBLICATIONS

Second Chinese Office Action (w/ English Translation) for corresponding Chinese Application No. 201910464912.7, dated Jun. 3, 2021, 13 pages.

* cited by examiner

LIGHT-EMITTING DEVICE AND METHOD FOR MANUFACTURING THE SAME, AND DISPLAY PANEL

CROSS-REFERENCE TO RELATED APPLICATIONS

This application is a national phase entry under 35 USC 371 of International Patent Application No. PCT/CN2020/092580 filed on May 27, 2020, which claims priority to Chinese Patent Application No, 201910464912.7, filed on May 30, 2019, which are incorporated herein by reference in their entirety.

TECHNICAL FIELD

The present disclosure relates to the field of display technologies, and in particular, to a light-emitting device and a method for manufacturing the same, and a display panel.

BACKGROUND

With the development of display technologies, top emission type light-emitting devices have received more and more attention due to their good device stability and rectification ratio.

SUMMARY

In one aspect, a light-emitting device is provided. The light-emitting device includes: an anode disposed on a base, and a cathode disposed on a side of the anode facing away from the base. The anode includes a light-reflecting sub-electrode and a light-transmitting sub-electrode located on a surface of the light-reflecting sub-electrode away from the base, and an orthographic projection of the light-transmitting sub-electrode on the base is located within a range of an orthographic projection of the light-reflecting sub-electrode on the base. The light-reflecting sub-electrode includes a metal pattern and a metal oxide pattern, and the metal oxide pattern is located in at least part of a region around the metal pattern.

In some embodiments, the metal oxide pattern surrounds the metal pattern.

In some embodiments, the metal pattern and the metal oxide pattern are an integrated structure.

In some embodiments, a material of the metal oxide pattern includes an oxide of a material of the metal pattern.

In some embodiments, an orthographic projection of the metal pattern on the base is located within a range of the orthographic projection of the light-transmitting sub-electrode on the base.

In some embodiments, a boundary of the orthographic projection of the metal pattern on the base and a boundary of the orthographic projection of the light-transmitting sub-electrode on the base have a distance therebetween, the distance is within a range from 0.1 μm to 1 μm.

In some embodiments, the orthographic projection of the light-reflecting sub-electrode on the base coincides with the orthographic projection of the light-transmitting sub-electrode on the base.

In some embodiments, the light-emitting device further includes a light-emitting layer disposed between the anode and the cathode. The light-emitting layer is an organic light-emitting layer or a quantum dot light-emitting layer.

In some embodiments, a material of the cathode includes a light-transmitting material.

In another aspect, a method for manufacturing a light-emitting device is provided. The method includes: forming an anode on a base; and forming a cathode on a side of the anode facing away from the base. Forming the anode includes: forming a metal film on the base; forming a light-transmitting conductive film on a surface of the metal film facing away from the base; patterning the light-transmitting conductive film and the metal film using a single patterning process to form a light-transmitting sub-electrode and a metal pattern, an orthographic projection of the metal pattern on the base being located within a range of an orthographic projection of the light-transmitting sub-electrode on the base; and performing an oxidation treatment on at least part of the metal pattern that is in noncontact with the light-transmitting sub-electrode to form a metal oxide pattern located in at least part of a region around the metal pattern, and to obtain a light-reflecting sub-electrode, the orthographic projection of the light-transmitting sub-electrode on the base is located within a range of an orthographic projection of the light-reflecting sub-electrode on the base.

In some embodiments, performing the oxidation treatment on the at least part of the metal pattern that is in noncontact with the light-transmitting sub-electrode, includes: placing the at least part of the metal pattern that is in noncontact with the light-transmitting sub-electrode in an electrolyte, and energizing the metal pattern to make the at least part of the metal pattern react with the electrolyte using an anodic oxidation method to obtain the metal oxide pattern located in the at least part of the region around the metal pattern.

In some embodiments, the electrolyte includes ethylene glycol and ammonium tartrate.

In yet another aspect, a display panel is provided. The display panel includes the base and a plurality of light-emitting devices as described in some embodiments above. The plurality of light-emitting devices are disposed on the base.

In some embodiments, the display panel further includes a plurality of pixel driving circuits disposed between the base and the plurality of light-emitting devices. At least one pixel driving circuit includes a driving transistor, and one of a source electrode and a drain electrode of the driving transistor is electrically connected to an anode of one of the plurality of light-emitting devices.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely some embodiments of the present disclosure, and other accompanying drawings may be obtained according to these accompanying drawings by a person of ordinary skill in the art. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
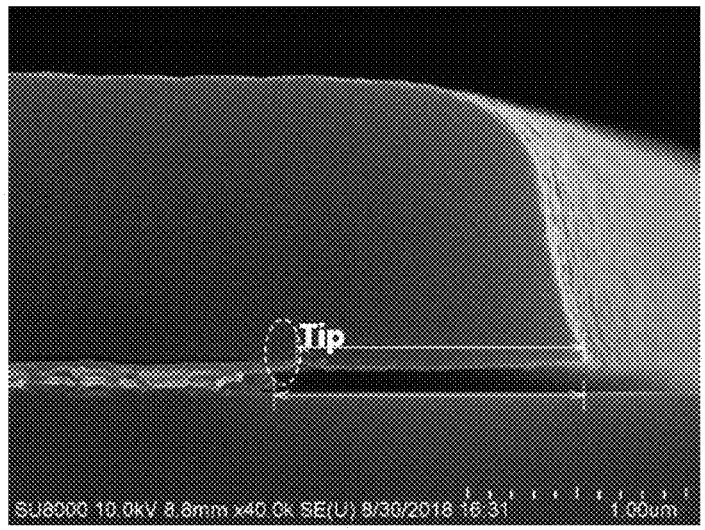
FIG. 1 is a scanning electron microscope (SEM) image of an anode in the related art.

Technical solutions in some embodiments of the present disclosure will be described below clearly and completely in combination with the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

In the description of some embodiments, a term such as "connected" and its extensions may be used. For example, the term "connected" may be used in the description of some embodiments to indicate that two or more elements are in direct physical contact or electric contact with each other. The embodiments disclosed herein are not necessarily limited to the contents herein.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

The use of "adapted to" or "configured to" herein is meant as open and inclusive language that does not foreclose devices adapted to or configured to perform additional tasks or steps.

Additionally, the use of "based on" is meant to be open and inclusive, in that a process, step, calculation, or other action "based on" one or more recited conditions or values may, in practice, be based on additional conditions or value beyond those recited.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to sectional views and/or plan views as idealized exemplary drawings. In the drawings, thicknesses of layers and regions may be exaggerated for clarity. Therefore, variations in shapes with respect to the drawings due to, for example, manufacturing techniques and/or tolerances are conceivable. Therefore, the exemplary embodiments should not be construed as being limited to the shapes of the regions shown herein, but include shape deviations due to, for example, manufacturing. For example, an etched region that is shown to have a rectangular shape generally has a curved feature. Therefore, the regions illustrated in the drawings are schematic and their shapes are not intended to illustrate the actual shapes of the regions in an apparatus and are not intended to limit the scope of the exemplary embodiments.

In the related art, a display panel may include a plurality of top emission type light-emitting devices. Light emitted by the plurality of top emission type light-emitting devices exits from tops of the top emission type light-emitting devices (e.g., cathode sides of the top emission type light-emitting devices). In the transmission process, the light may avoid being affected by pixel driving circuits in the display panel, so that the display panel may have a large aperture ratio. Moreover, a service life of the top emission type light-emitting devices may also be prolonged.

Some embodiments of the present disclosure provide a light-emitting device 100. As shown in FIGS. 2 to 7, the light-emitting device 100 includes an anode 2 disposed on a side of a base 1, and a cathode 3 disposed on a side of the anode 2 away from the base 1.

In some examples, in a case where the light-emitting device 100 is applied to a display panel, the cathode 3 may be located on a light exit side of the display panel.

In some examples, as shown in FIGS. 2, 3, and 5 to 7, the light-emitting device 100 further includes a light-emitting layer 4 disposed between the cathode 3 and the anode 2.

In a case where voltages are transmitted to the anode 2 and the cathode 3 respectively, holes supplied by the anode 2 and electrons supplied by the cathode 3 will migrate into the light-emitting layer 4, so that the light-emitting layer 4 can emit light under an action of the energy generated when the holes and the electrons are recombined.

Types of the light-emitting layer 4 may be various, which may be selected and set according to actual needs.

For example, the light-emitting layer 4 may be an organic light-emitting layer. That is, a material of the light-emitting layer 4 includes an organic light-emitting material. In this case, the light-emitting device 100 may be referred to as an organic light-emitting diode (OLED).

For another example, the light-emitting layer 4 may be a quantum dot light-emitting layer. That is, the material of the light-emitting layer 4 includes a quantum dot material. In this case, the light-emitting device 100 may be referred to as a quantum dot light-emitting diode (QLED).

In some examples, as shown in FIGS. 2 to 7, the anode 2 includes a light-reflecting sub-electrode 21.

A material of the light-reflecting sub-electrode 21 includes a metal material with a high light reflectivity. The light-reflecting sub-electrode 21 can cause all light incident onto the light-reflecting sub-electrode 21 to be substantially reflected.

In some examples, a material of the cathode 3 includes a light-transmitting material. For example, the light-transmitting material includes a conductive material with a high light transmittance. For example, the conductive material may be indium tin oxide (ITO) or indium zinc oxide (IZO).

In this way, in the light emitted from the light-emitting layer 4, at least a portion of light directed towards the cathode 3 may directly pass through the cathode 3 and exit, and a portion of light directed towards the anode 2 may be directed towards the cathode 3 under a reflection action of the light-reflecting sub-electrode 21, and then pass through the cathode 3 and exit, so that the light-emitting device 100 may be a top emission type light-emitting device.

In some examples, as shown in FIGS. 2 to 7, the anode 2 further includes: a light-transmitting sub-electrode 22 located on a side of the light-reflecting sub-electrode 21 away from the base 1.

In some examples, in a process where the holes migrate from a highest occupied molecular orbital (HOMO) of the light-reflecting sub-electrode 21 to a HOMO of the light-emitting layer 4, since there exists a large difference in energy levels between the HOMO of the light-reflecting sub-electrode 21 and the HOMO of the light-emitting layer 4, that is, a potential barrier of a migration of the holes is large, it is difficult for the holes to migrate. In the present disclosure, the light-transmitting sub-electrode 22 is disposed on the side of the light-reflecting sub-electrode 21 away from the base 1 (in this case, the light-transmitting sub-electrode 22 is located on a side of the light-reflecting sub-electrode 21 proximate to the light-emitting layer 4). In this way, when the holes migrate from the HOMO of the light-reflecting sub-electrode 21 to the HOMO of the light-emitting layer 4, the holes may first migrate from the HOMO of the light-reflecting sub-electrode 21 to a HOMO of the light-transmitting sub-electrode 22, and then migrate from the HOMO of the light-transmitting sub-electrode 22 to the HOMO of the light-emitting layer 4. In this way, the potential barrier of the hole migration is reduced, and a work function difference between the light-reflecting sub-electrode 21 and the light-emitting layer 4 is reduced, which is beneficial to the migration of the holes.

A material of the light-transmitting sub-electrode 22 may be various, which may be selected and set according to actual needs. For example, the material of the light-transmitting sub-electrode 22 may be, for example, ITO or IZO.

In some examples, as shown in FIGS. 2 to 7, the light-reflecting sub-electrode 21 includes a metal pattern 211 and a metal oxide pattern 212, and the metal oxide pattern 212 is located in at least part of a region around the metal pattern 211. The metal pattern 211 and the metal oxide pattern 212 may be connected to each other without a gap therebetween.

Here, the metal oxide pattern 212 being located in the at least part of the region around the metal pattern 211 includes a plurality of arrangement manners.

Figure 3:
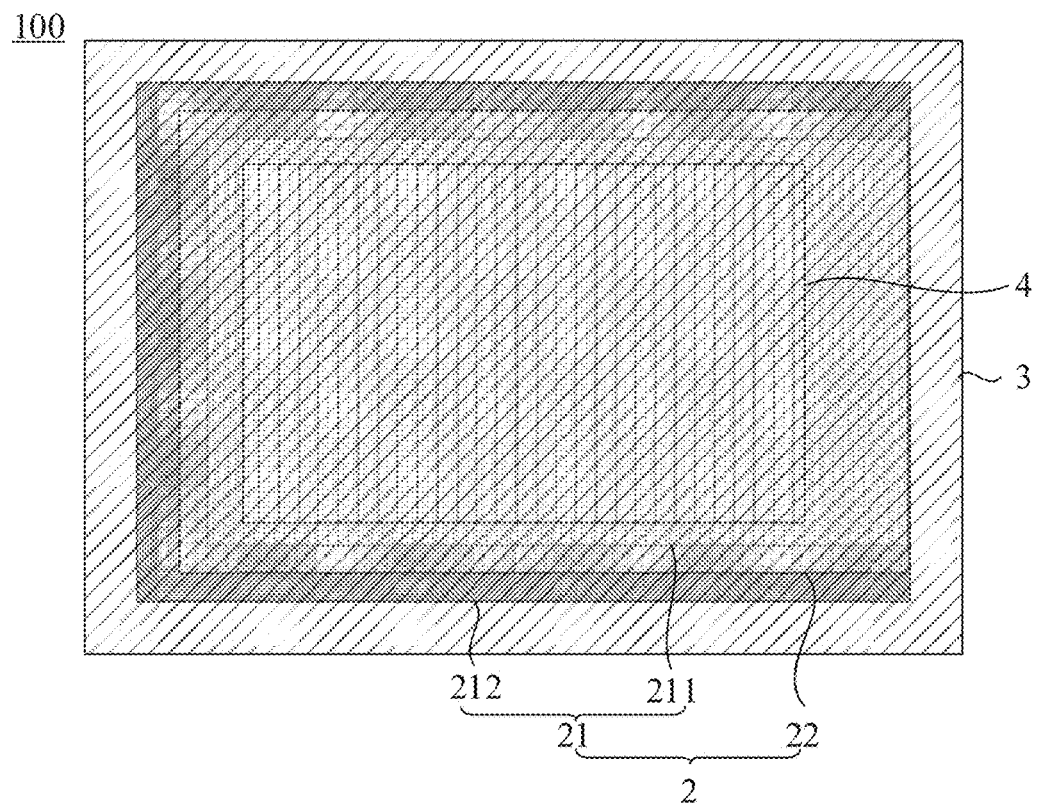
FIG. 3 is a diagram showing a structure of another light-emitting device, in accordance with some embodiments of the present disclosure.

For example, as shown in FIG. 3, the metal oxide pattern 212 may be located in a part of the region around the metal pattern 211. In this case, a shape of the metal oxide pattern 212 may be, for example, a stripe shape, a "U" shape or an arc shape.

Figure 2:
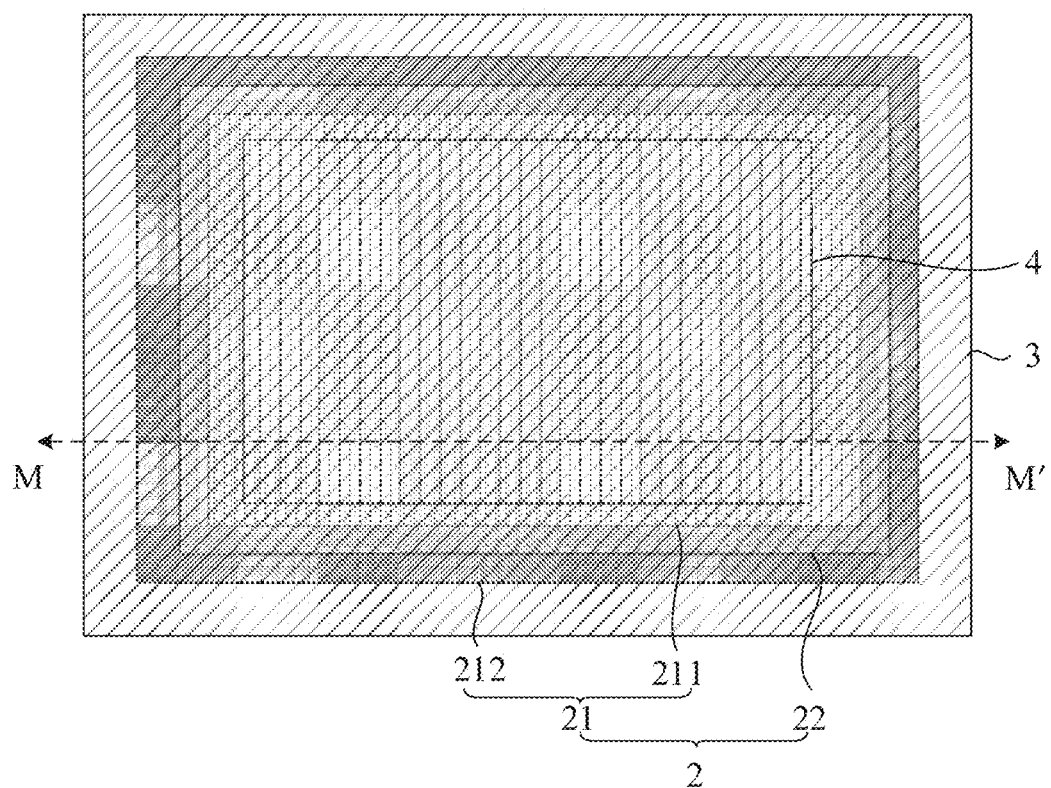
FIG. 2 is a diagram showing a structure of a light-emitting device, in accordance with some embodiments of the present disclosure.

For example, as shown in FIG. 2, the metal oxide pattern 212 may surround the metal pattern 211. In this case, the shape of the metal oxide pattern 212 may be a ring (such as, a circular ring or a square ring), and the metal pattern 211 is located in a center of the metal oxide pattern 212.

Figure 4:
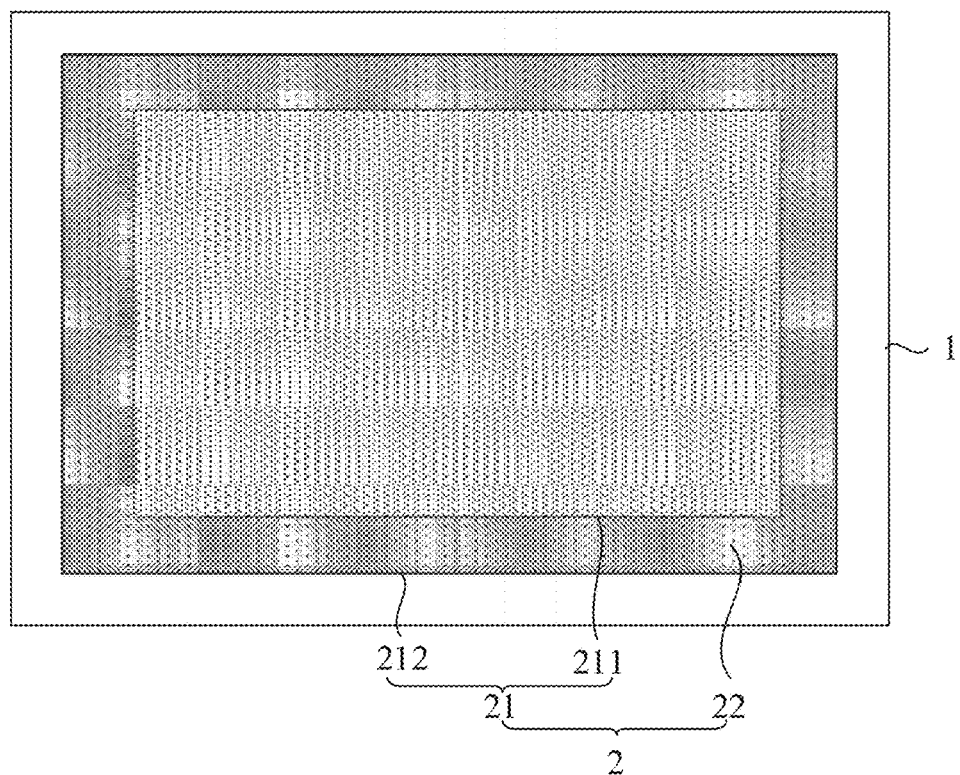
FIG. 4 is a diagram showing a structure of yet another light-emitting device, in accordance with some embodiments of the present disclosure.
Figure 5:
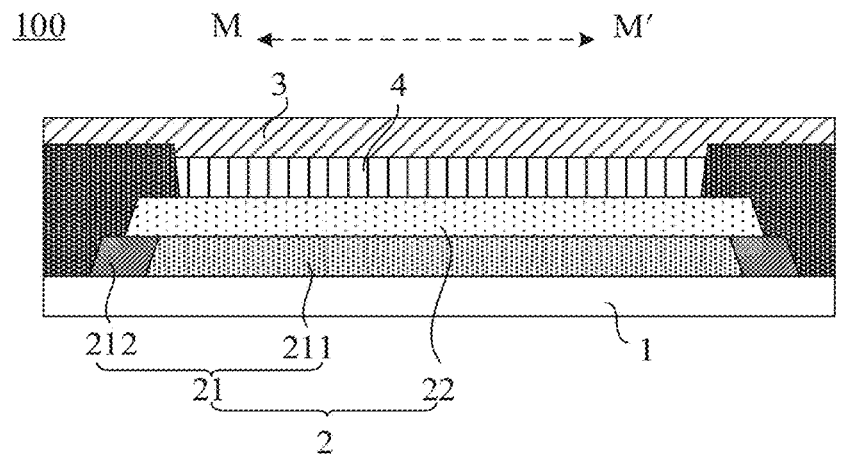
FIG. 5 is a sectional view of the light-emitting device shown in FIG. 2 taken along direction M-M'.

In some examples, as shown in FIGS. 2 to 4, an orthographic projection of the light-transmitting sub-electrode 22 on the base 1 is located within a range of an orthographic projection of the light-reflecting sub-electrode 21 on the base 1. That is, an area of the orthographic projection of the light-transmitting sub-electrode 22 on the base 1 is less than an area of the orthographic projection of the light-reflecting sub-electrode 21 on the base 1. An outer boundary of the orthographic projection of the light-transmitting sub-electrode 22 on the base 1 partially overlaps with an outer boundary of the orthographic projection of the light-reflecting sub-electrode 21 on the base 1, or there exists a gap between the two outer boundaries. Or, as shown in FIG. 4, the orthographic projection of the light-reflecting sub-electrode 21 on the base 1 coincides with the orthographic projection of the light-transmitting sub-electrode 22 on the base 1.

This means that the light-reflecting sub-electrode 21 can uniformly support the entire light-transmitting sub-electrode 22, which avoids a situation that at least a portion of the light-transmitting sub-electrode 22 is in a suspended state.

Here, in a case where the orthographic projection of the light-reflecting sub-electrode 21 on the base 1 coincides with the orthographic projection of the light-transmitting sub-electrode 22 on the base 1 (that is, the area of the orthographic projection of the light-reflecting sub-electrode 21 on the base 1 is equal to the area of the orthographic projection of the light-transmitting sub-electrode 22 on the base 1), the light-transmitting sub-electrode 22 may be just completely supported by the light-reflecting sub-electrode 21. In this way, not only may the light-reflecting sub-electrode 21 be used to support the entire light-transmitting sub-electrode 22 well, but also a usage amount of the material of the light-reflecting sub-electrode 21 may be reduced, which saves a production cost of the light-emitting device 100.

In some examples, the anode may be formed using a single patterning process. That is, a metal film and a light-transmitting conductive film may be sequentially formed on a side of the base 1, and then a photolithography process is used to pattern the two films simultaneously to form the anode, so as to simplify a manufacturing process of the anode. However, when a photoresist used in the photolithography process is removed in the follow-up process, the patterned metal film is easily affected by a solution of the photoresist (for example, is corroded). As shown in HG. 1, an orthographic projection of the patterned metal film on the base 1 is located within a range of an orthographic projection of the patterned light-transmitting conductive film on the base 1. This will cause the patterned light-transmitting conductive film to protrude from the patterned metal film, and a protruding portion (i.e., the tip shown in FIG. 1) of the patterned light-transmitting conductive film is in a suspended state without being supported. In this way, when other layers (e.g., a light-emitting layer and a cathode) are subsequently formed on a side of the patterned light-transmitting conductive film away from the base 1, a force unbalance phenomenon may easily occur in the protruding portion which then is prone to bend or be suddenly fractured. As a result, a uniformity of the patterned light-transmitting conductive film is reduced, which affects a uniformity of the light-emitting layer, resulting in poor light emission of the light-emitting device.

However, in the light-emitting device 100 provided by some embodiments of the present disclosure, the metal oxide pattern 212 is disposed in the at least part of the region around the metal pattern 211 included in the light-reflecting sub-electrode 21 in the anode 2, and the orthographic projection of the light-transmitting sub-electrode 22 on the base is located within the range of the orthographic projection of the light-reflecting sub-electrode 21 on the base 1. In this way, the light-reflecting sub-electrode 21 may be used to uniformly support the entire light-transmitting sub-electrode 22. That is, the metal oxide pattern 212 is used to support at least a portion of the light-transmitting sub-electrode 22 protruding from the metal pattern 211, which prevents at least a portion of the light-transmitting sub-electrode 22 from being in the suspended state. In this way, the entire light-transmitting sub-electrode 22 may be made to bear a pressure from other layers (i.e., the light-emitting layer 4, the cathode 3 and the like that are subsequently formed on the side of the anode 2 away from the base 1) more uniformly, which avoids bending or sudden fracturing of the light-transmitting sub-electrode 22 due to uneven force, thereby facilitating the improvement of the uniformity of the light-emitting layer 4 and a light-emitting effect of the light-emitting device 100. In addition, it is also possible to improve a production yield of a display apparatus to which the light-emitting device 100 is applied.

In some examples, as shown in FIG. 2, the orthographic projection of the metal pattern 211 on the base 1 is located within the range of the orthographic projection of the light-transmitting sub-electrode 22 on the base 1. Here, the area of the orthographic projection of the metal pattern 211 on the base 1 is less than the area of the orthographic projection of the light-transmitting sub-electrode 22 on the base 1, and an outer boundary of the orthographic projection of the metal pattern 211 on the base 1 partially overlaps with the outer boundary of the orthographic projection of the light-transmitting sub-electrode 22 on the base 1, or there exists a gap between the two boundaries.

In some examples, a distance between the outer boundary of the orthographic projection of the metal pattern 211 on the base 1 and the outer boundary of the orthographic projection of the light-transmitting sub-electrode 22 on the base 1 may be within a range from 0.1 μm to 1 μm. That is, the orthographic projection of the metal pattern 211 on the base 1 is located in a middle of the orthographic projection of the light-transmitting sub-electrode 22 on the base 1, and there exists a gap between the outer boundaries of the two. In this case, the metal oxide pattern 212 may surround the metal pattern 211.

For example, the distance between the outer boundary of the orthographic projection of the metal pattern 211 on the base 1 and the outer boundary of the orthographic projection of the light-transmitting sub-electrode 22 on the base 1 may be, for example, 0.1 μm, 0.3 μm, 0.5 μm, 0.8 μm, or 1 μm.

Since the orthographic projection of the light-transmitting sub-electrode 22 on the base 1 is located within the range of the orthographic projection of the light-reflecting sub-electrode 21 on the base 1, the metal oxide pattern 212 may have a certain size (i.e., a size in a direction parallel to the base 1), thereby ensuring a stability of a structure of the metal oxide pattern 212, and avoiding a situation that the metal oxide pattern 212 is prone to be fractured due to a small size.

In some embodiments, a material of the metal oxide pattern 212 includes an oxide of a material of the metal pattern 211.

In some examples, the material of the metal pattern 211 may be, for example, aluminum (Al) or silver (Ag) with a high light reflectivity.

It will be understood that, in a case where the material of the metal pattern 211 is Al, the material of the metal oxide pattern 212 is an oxide of aluminum, such as aluminum oxide ($Al_2O_3$). In a case where the material of the metal pattern 211 is silver (Ag), the material of the metal oxide pattern 212 is an oxide of silver, such as silver oxide ($Ag_2O$).

In some examples, the metal oxide pattern 212 may be a pattern formed by a metal oxide generated after an oxidation reaction of the metal material in at least part of the metal pattern 211 that is in noncontact with the light-transmitting sub-electrode 22. In this case, the metal pattern 211 and the metal oxide pattern 212 may be an integrated structure. In this way, it is beneficial to ensure a stability of an overall structure of the light-reflecting sub-electrode 21, and avoid a situation that the metal oxide pattern 212 and the metal pattern 211 are separated. Furthermore, it is beneficial to further ensure that the light-reflecting sub-electrode 21 provides a good support for the entire light-transmitting sub-electrode 22, and further prevent the light-transmitting sub-electrode 22 from bending or being suddenly fractured due to the uneven force.

Figure 6:
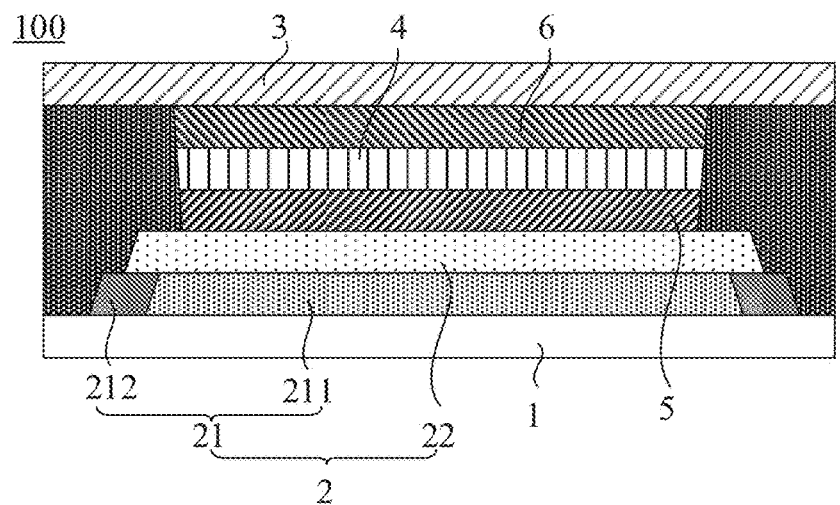
FIG. 6 is another sectional view of the light-emitting device shown in FIG. 2 taken along the direction M-M'.

In some embodiments, as shown in FIG. 6, the light-emitting device 100 further includes: a hole transport layer 5 located between the light-emitting layer 4 and the anode 2, and an electron transport layer 6 located between the light-emitting layer 4 and the cathode 3. In this way, a mobility of the holes and the electrons may be improved, and the light-emitting effect of the light-emitting device 100 may be improved.

Figure 7:
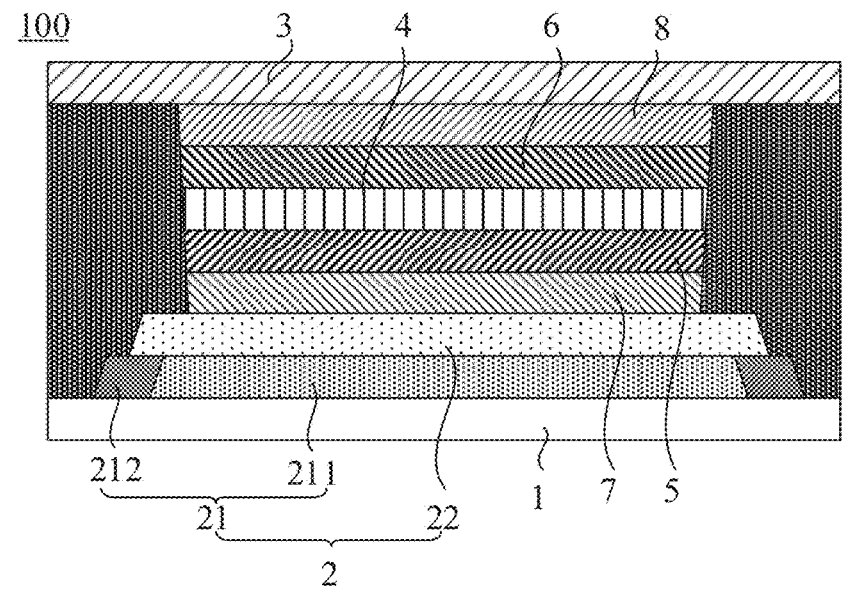
FIG. 7 is yet another sectional view of the light-emitting device shown in FIG. 2 taken along the direction M-M'.

Of course, as shown in FIG. 7, the light-emitting device 100 may further include: a hole injection layer 7 located between the hole transport layer 5 and the anode 2, and an electron injection layer 8 located between the electron transport layer 6 and the cathode 3. In this way, the mobility of the holes and the electrons may be further improved, and the light-emitting effect of the light-emitting device 100 may be further improved.

Figure 8:
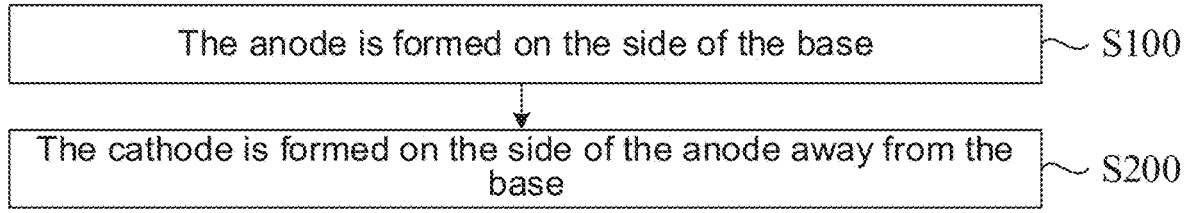
FIG. 8 is a flow diagram of a method for manufacturing a light-emitting device, in accordance with some embodiments of the present disclosure.

Some embodiments of the present disclosure provide a method for manufacturing the light-emitting device. As shown in FIG. 8, the manufacturing method includes step 100 to step 200 (S100 to S200).

Figure 10:
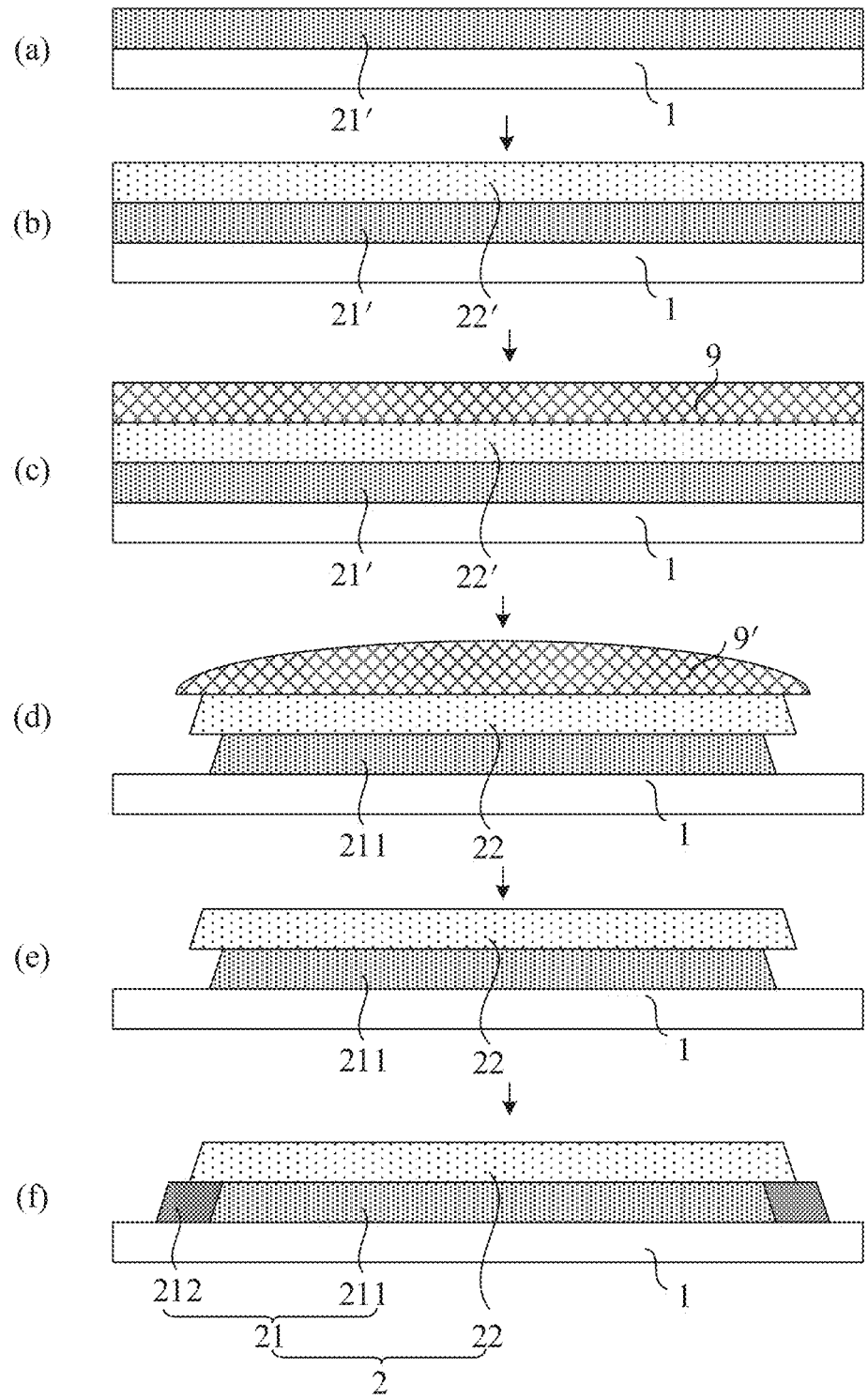
FIG. 10 is a diagram of a manufacturing process of S100 in FIG. 8.

In S100, as shown in (f) in FIG. 10, the anode 2 is formed on the side of the base 1.

Figure 11:
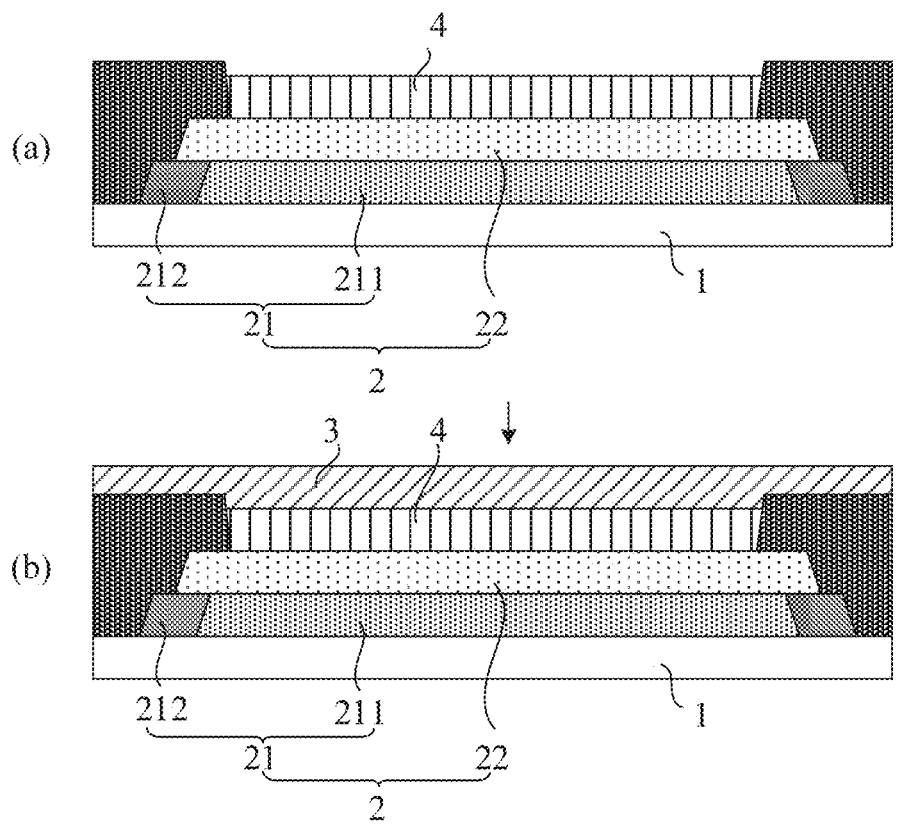
FIG. 11 is a flow diagram of S200 in FIG. 8.

In 3200, as shown in FIG. 11, the cathode 3 is formed on the side of the anode 2 away from the base 1.

For example, a conductive film may be formed using a magnetron sputtering process, and then the conductive film is patterned using a photolithography process or a wet etching process to form the cathode 3.

Figure 9:
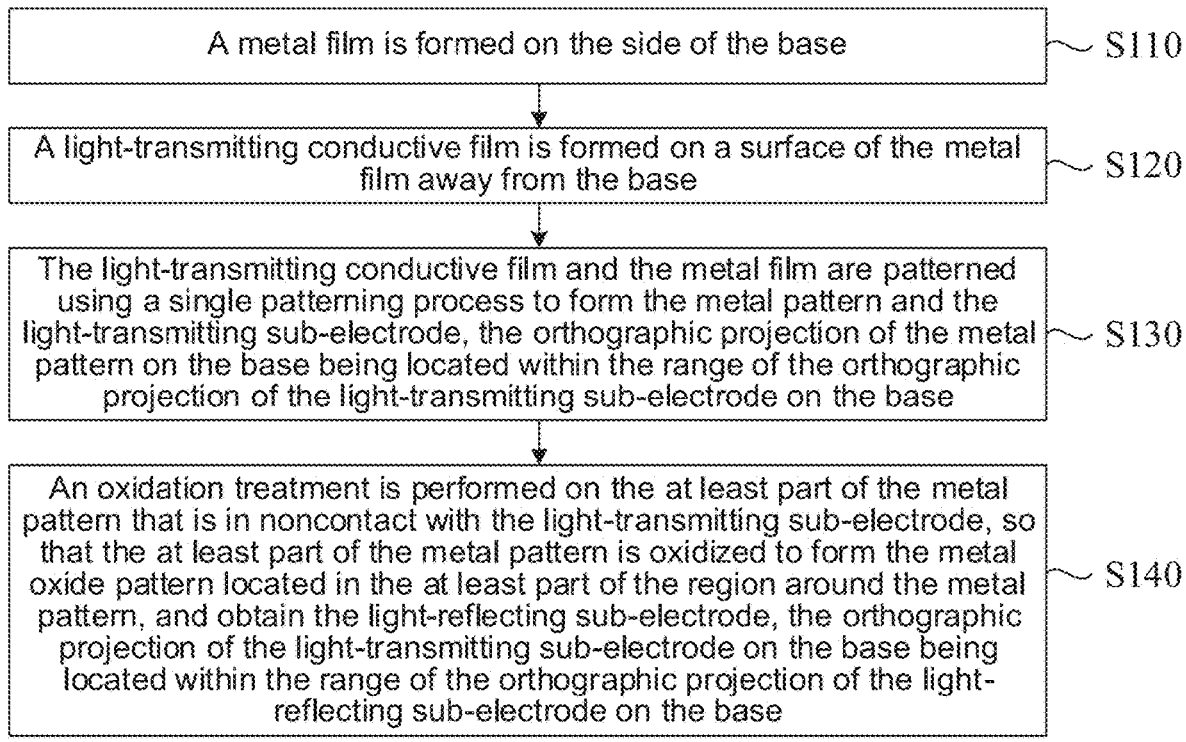
FIG. 9 is a flow diagram of S100 in FIG. 8.

In some examples, as shown in FIG. 9, forming the anode 2 includes; step 110 to step 140 (3110 to S140).

In 3110, as shown in (a) in FIG. 10, a metal film 21' is formed on the side of the base 1.

For example, the metal film 21' may be formed using a magnetron sputtering process.

Here, a thickness of the metal film 21' may be, for example, 100 nm to 200 nm. For example, the thickness of the metal film 21' may be 100 nm, 120 nm, 150 nm, 170 nm, or 200 nm.

In S120, as shown in (b) in FIG. 10, a light-transmitting conductive film 22' is formed on a surface of the metal film 21' away from the base 1.

For example, the light-transmitting conductive film 22' may be formed using a magnetron sputtering process, an evaporation process or a coating process.

Here, a thickness of the light-transmitting conductive film 22' may be, for example, 15 nm to 90 nm. For example, the thickness of the light-transmitting conductive film 22' may be 15 nm, 30 nm, 50 nm, 75 nm, or 90 nm.

In S130, as shown in (c) to (e) in FIG. 10, the light-transmitting conductive film 22' and the metal film 21' are patterned using a single patterning process to form the metal pattern 211 and the light-transmitting sub-electrode 22. The orthographic projection of the metal pattern 211 on the base 1 is located within the range of the orthographic projection of the light-transmitting sub-electrode 22 on the base 1.

For example, the single patterning process may include film forming, exposure, development and etching processes.

For example, the single patterning process is the photolithography process.

Here, a process of forming the metal pattern 211 and the light-transmitting sub-electrode 22 using the photolithography process includes: for example, coating a side of the light-transmitting conductive film 22' away from the base 1 with the photoresist to form a photoresist layer 9; exposing the photoresist layer using a mask to transfer a pattern of the mask to the photoresist layer; developing the photoresist layer; and patterning the light-transmitting conductive film 22' and the metal film 21' with the developed photoresist layer 9' as a mask to obtain the light-transmitting sub-electrode 22 and the metal pattern 211.

Here, after the light-transmitting sub-electrode 22 and the metal pattern 211 are obtained, the developed photoresist layer needs to be removed. For example, the developed photoresist layer may be removed using a solvent corresponding to its polarity.

In S140, as shown in (f) in FIG. 10, an oxidation treatment is performed on at least part of the metal pattern 211 that is in noncontact with the light-transmitting sub-electrode 22, so that the at least part of the metal pattern 211 is oxidized to form the metal oxide pattern 212 located in the at least part of the region around the metal pattern 211, and obtain the light-reflecting sub-electrode 21. The orthographic projection of the light-transmitting sub-electrode 22 on the base 1 is located within the range of the orthographic projection of the light-reflecting sub-electrode 21 on the base 1.

That is, the metal oxide layer pattern 212 is obtained by oxidizing the at least part of the metal pattern 211. In this way, it is possible to make the metal oxide layer pattern 212 and the metal pattern 211 be an integrated structure, and the two are in close contact, which is beneficial to make the light-reflecting sub-electrode 21 have a relatively stable structure, and to further ensure that the light-reflecting sub-electrode 21 provides a good support for the entire light-transmitting sub-electrode 22.

In the method for manufacturing the light-emitting device provided by some embodiments of the present disclosure, after patterning the light-transmitting conductive film 22' and the metal film 21' using the single patterning process to obtain the metal pattern 211 and the light-transmitting sub-electrode 22, by performing the oxidation treatment on the at least part of the metal pattern 211, it enables the at least part of the metal pattern 211 to be oxidized to form the metal oxide pattern 212, and enables the orthographic projection of the light-transmitting sub-electrode 22 on the base 1 to be located within the range of the orthographic projection of the light-reflecting sub-electrode 21 including the metal pattern 211 and the metal oxide pattern 212 on the base 1, which may make the light-transmitting sub-electrode 22 to be able to be fully supported by the light-reflecting sub-electrode 21. In this way, in a process of manufacturing the light-emitting layer 4 and the cathode 3 on the side of the anode 2 away from the base 1, the light-transmitting sub-electrode 22 may uniformly bear the force given by the light-emitting layer 4 and the cathode 3, which avoids the situation that the light-transmitting sub-electrode 22 is bent or suddenly fractured due to the uneven force, and is beneficial to improve the uniformity of the light-emitting layer 4 that is formed on the side of the anode 2 away from the base 1 in the follow-up process, and is further beneficial to improve the light-emitting effect of the manufactured light-emitting device 100. In addition, it is also possible to improve the production yield of the display apparatus to which the light-emitting device 100 is applied.

In some embodiments, in S140, performing the oxidation treatment on the at least part of the metal pattern 211, so that the at least part of the metal pattern 211 is oxidized, includes: placing the at least part of the metal pattern 211 that is in noncontact with the light-transmitting sub-electrode 22 in an electrolyte and energizing the metal pattern 211 to make the at least part of the metal pattern 211 react with the electrolyte using an anodic oxidation method to obtain the metal oxide pattern 212 located in the at least part of the region around the metal pattern 211.

In some examples, a relative positional relationship between the metal pattern 211 and the metal oxide pattern 212 may be determined according to an area of a portion of the metal pattern 211 placed in the electrolyte.

For example, part of the metal pattern 211 is placed in the electrolyte. In this case, the part placed in the electrolyte may react with the electrolyte, so that the formed metal oxide pattern 212 is located in the part of the region around the metal pattern 211.

For example, the entire of the metal pattern 211 is placed in the electrolyte. In this case, sides of the metal pattern 211 may react with the electrolyte, so that the formed metal oxide pattern 212 surrounds the metal pattern 211.

Here, placing the metal pattern 211 in the electrolyte and energizing the metal pattern 211 may be that, for example, the base 1 on which the light-transmitting sub-electrode 22 and the metal pattern 211 are formed is placed in the electrolyte and energized. In this way, in a case where a plurality of metal patterns 211 are formed on the base 1, at least parts of the plurality of metal patterns 211 may be simultaneously oxidized; which is beneficial to improve the manufacturing efficiency of the light-emitting device 100.

A material of the metal film 21' may be various, which may be selected and set according to actual needs.

For example, the material of the metal film 21' includes Al. Accordingly, the material of the formed metal oxide pattern 212 may include the oxide of aluminum, such as $Al_2O_3$.

For example, the material of the metal film 21' includes Ag. Accordingly, the material of the formed metal oxide pattern 212 may include the oxide of silver, such as $Ag_2O$.

In some examples, a size of the generated metal oxide pattern 212 may be controlled by controlling an energization time period. That is, in a case where the energization time period is long, the size of the generated metal oxide pattern 212 is large; and in a case where the energization time period is short, the size of the generated metal oxide pattern 212 is small.

Here, when the generated metal oxide pattern 212 reaches a certain size, the energization may be ended, so that the metal oxide pattern 212 stops growing.

In some examples, the electrolyte may include ethylene glycol, ammonium tartrate, and the like.

Figure 12:
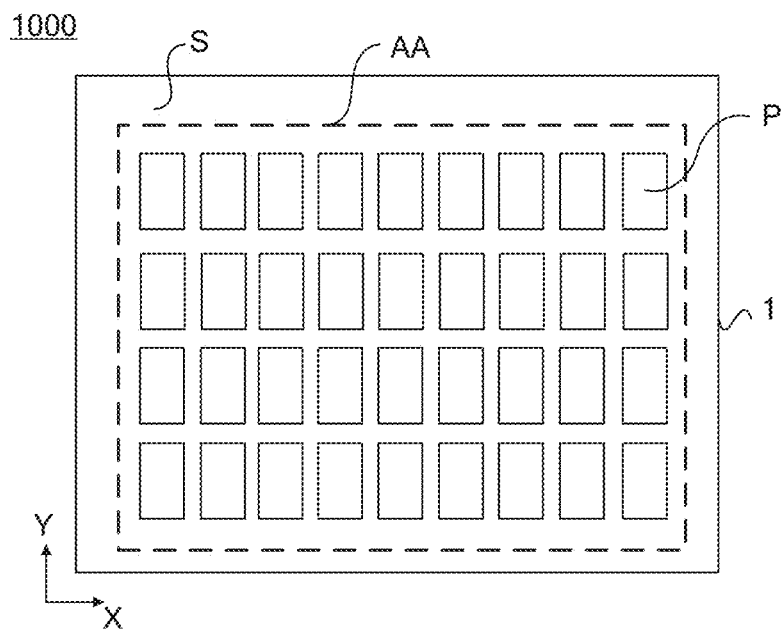
FIG. 12 is a diagram showing a structure of a display panel, in accordance with some embodiments of the present disclosure.
Figure 13:
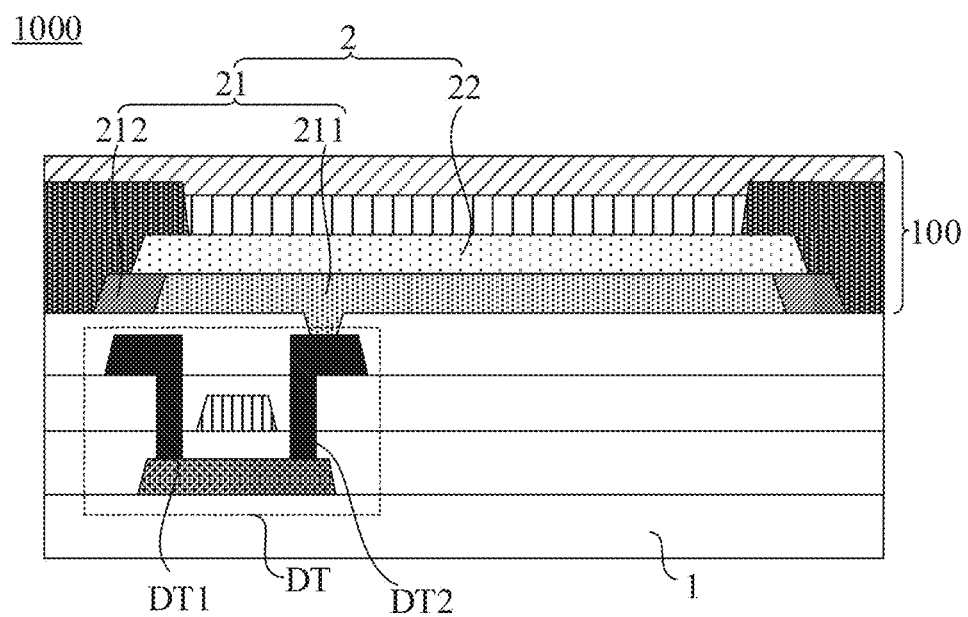
FIG. 13 is a diagram showing a structure of another display panel, in accordance with some embodiments of the present disclosure.

Some embodiments of the present disclosure provide a display panel 1000. As shown in FIGS. 12 and 13, the display panel 1000 includes the base 1 and a plurality of light-emitting devices 100 as provided in some embodiments above. The plurality of light-emitting devices 100 are disposed on a side of the base 1.

Types of the base 1 may be various, which may be selected and set according to actual needs.

For example, the base 1 may be a rigid base. The rigid base may be, for example, a glass base or a polymethyl methacrylate (PMMA) base.

For another example, the base 1 may be a flexible base. The flexible base may be, for example, a polyethylene terephthalate (PET) base, a polyethylene naphthalate (PEN) base, or a polyimide (PI) base.

In the display panel 1000 provided by some embodiments of the present disclosure, the included light-emitting devices 100 have the same structure as the light-emitting device 100 provided in some embodiments above, and beneficial effects achieved by the display panel 1000 are the same as beneficial effects achieved by the light-emitting device 100 provided in some embodiments above.

In some embodiments, as shown in FIG. 12, the display panel 1000 has an active area (AA region) and a peripheral region S located on at least one side of the AA region. Here, the peripheral region S may be located on one side, two sides, or three sides of the AA region. Of course, as shown in FIG. 12, the peripheral region S may also be disposed around the AA region.

In some examples, a plurality of sub-pixels P are provided in the AA region. Each sub-pixel P can display one color. For example, each sub-pixel can display a first color, a second color, or a third color, and the first color, the second color and the third color may be three primary colors (e.g., red, green and blue).

For example, the embodiments of the present disclosure is illustratively described by taking an example where the plurality of sub-pixels P are arranged in a matrix form.

In this case, sub-pixels P arranged in a first direction X may be referred to as sub-pixels in a same row, and sub-pixels P arranged in a second direction Y may be referred to as sub-pixels in a same column.

On this basis, optionally, the sub-pixels in the same row may be connected to a gate line, and the sub-pixels in the same column may be connected to a data line.

In some examples, as shown in FIG. 13, each sub-pixel P includes one light-emitting device 100, and a pixel driving circuit disposed between the base 1 and the light-emitting device 100 (represented by a driving transistor DT). The pixel driving circuit is configured to drive the light-emitting device 100 to emit light, so that the display panel 1000 can display an image.

In some examples, the pixel driving circuit is composed of a plurality of thin film transistors (TFTs), at least one capacitor and other electronic devices. The plurality of TFTs include the driving TFT and at least one switching TFT, and the driving TFT may be connected to the light-emitting device 100. For example, the pixel driving circuit may be a pixel driving circuit of a 2T1C (T representing to the thin film transistor, and C representing to the capacitor) structure composed of two TFTs (including one switching TFT and one driving TFT) and one capacitor. Of course, the pixel driving circuit may also be a pixel driving circuit of an mTnC structure composed of two or more TFTs (including a plurality of switching TFTs and one driving TFT) and at least one capacitor (m being greater than or equal to three, n being greater than or equal to one, and both m and n being integers).

In some examples, as shown in FIG. 13, the driving TFT DT included in the pixel driving circuit includes a source electrode DT1 and a drain electrode DT2. One of the source electrode DT1 and the drain electrode DT2 (e.g., the drain electrode DT2) is electrically connected to the anode 2 of the light-emitting device 100.

In this way, each pixel driving circuit may provide a driving voltage to the anode 2 of the light-emitting device 100 through one of the source electrode DT1 and the drain electrode DT2 of the driving TFT DT to drive the light-emitting device 100 to emit light.

Figure 14:
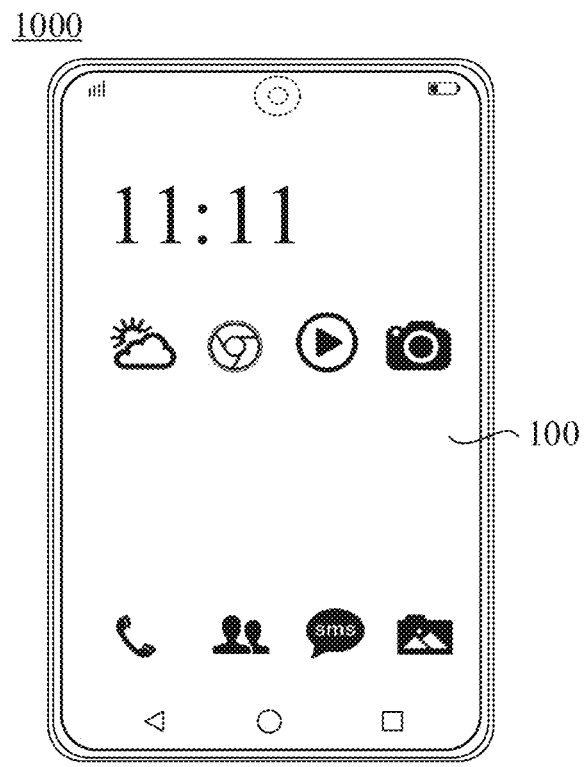
FIG. 14 is a diagram showing a structure of yet another display panel, in accordance with some embodiments of the present disclosure.

In some embodiments, the display panel 1000 may be any product or component having a display function, such as a mobile phone (as shown in FIG. 14), a tablet computer, a television, a display, a notebook computer, a digital photo frame or a navigator.

The foregoing descriptions are merely specific implementations of the present disclosure, but the protection scope of the present disclosure is not limited thereto. Any changes or replacements those skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising:
an anode disposed on a base; and
a cathode disposed on a side of the anode facing away from the base;
wherein the anode includes a light-reflecting sub-electrode and a light-transmitting sub-electrode located on a surface of the light-reflecting sub-electrode facing away from the base, and an orthographic projection of the light-transmitting sub-electrode on the base is located within a range of an orthographic projection of the light-reflecting sub-electrode on the base; and
the light-reflecting sub-electrode includes a metal pattern and a metal oxide pattern, and the metal oxide pattern is located in at least part of a region around the metal pattern.

2. The light-emitting device according to claim 1, wherein the metal oxide pattern surrounds the metal pattern.

3. The light-emitting device according to claim 1, wherein the metal pattern and the metal oxide pattern are an integrated structure.

4. The light-emitting device according to claim 1, wherein a material of the metal oxide pattern includes an oxide of a material of the metal pattern.

5. The light-emitting device according to claim 1, wherein an orthographic projection of the metal pattern on the base is located within a range of the orthographic projection of the light-transmitting sub-electrode on the base.

6. The light-emitting device according to claim 5, wherein a boundary of orthographic projection of the metal pattern on the base and a boundary of the orthographic projection of the light-transmitting sub-electrode on the base have a distance therebetween, the distance is within a range from 0.1 μm to 1 μm.

7. The light-emitting device according to claim 1, wherein the orthographic projection of the light-reflecting sub-electrode on the base coincides with the orthographic projection of the light-transmitting sub-electrode on the base.

8. The light-emitting device according to claim 1, further comprising: a light-emitting layer disposed between the anode and the cathode; wherein
the light-emitting layer is an organic light-emitting layer or a quantum dot light-emitting layer.

9. The light-emitting device according to claim 1, wherein a material of the cathode includes a light-transmitting material.

10. A method for manufacturing a light-emitting device, the method comprising:
forming an anode on a base; and
forming a cathode on a side of the anode facing away from the base;
wherein forming the anode includes:
forming a metal film on the base;
forming a light-transmitting conductive film on a surface of the metal film facing away from the base;
patterning the light-transmitting conductive film and the metal film using a single patterning process to form a light-transmitting sub-electrode and a metal pattern, an orthographic projection of the metal pattern on the base being located within a range of an orthographic projection of the light-transmitting sub-electrode on the base; and
performing an oxidation treatment on at least part of the metal pattern that is in noncontact with the light-transmitting sub-electrode to form a metal oxide pattern located in at least part of a region around the metal pattern, and to obtain a light-reflecting sub-electrode, the orthographic projection of the light-transmitting sub-electrode on the base being located within a range of an orthographic projection of the light-reflecting sub-electrode on the base.

11. The method according to claim 10, wherein performing the oxidation treatment on the at least part of the metal pattern that is in noncontact with the light-transmitting sub-electrode, includes:
placing the at least part of the metal pattern that is in noncontact with the light-transmitting sub-electrode in an electrolyte, and
energizing the metal pattern to make the at least part of the metal pattern react with the electrolyte using an anodic oxidation method to obtain the metal oxide pattern located in the at least part of the region around the metal pattern.

12. The method according to claim 11, wherein the electrolyte includes ethylene glycol and ammonium tartrate.

13. A display panel, comprising:
the base; and
a plurality of light-emitting devices according to claim 1; wherein the plurality of light-emitting devices are disposed on the base.

14. The display panel according to claim 13, further comprising: a plurality of pixel driving circuits disposed between the base and the plurality of light-emitting devices; wherein
at least one pixel driving circuit includes a driving transistor, and one of a source electrode and a drain electrode of the driving transistor is electrically connected to an anode of one of the plurality of light-emitting devices.

15. The light-emitting device according to claim 2, wherein the metal pattern and the metal oxide pattern are an integrated structure.

16. The light-emitting device according to claim 2, wherein a material of the metal oxide pattern includes an oxide of a material of the metal pattern.

17. The light-emitting device according to claim 3, wherein a material of the metal oxide pattern includes an oxide of a material of the metal pattern.

* * * * *